(12) United States Patent
Das et al.

(10) Patent No.: US 9,584,911 B2
(45) Date of Patent: Feb. 28, 2017

(54) MULTICHIP DYNAMIC RANGE ENHANCEMENT (DRE) AUDIO PROCESSING METHODS AND APPARATUSES

(71) Applicant: Cirrus Logic, Inc., Austin, TX (US)

(72) Inventors: Tejasvi Das, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 14/975,015

(22) Filed: Dec. 18, 2015

(65) Prior Publication Data

US 2016/0286310 A1    Sep. 29, 2016

Related U.S. Application Data

(60) Provisional application No. 62/139,123, filed on Mar. 27, 2015.

(51) Int. Cl.
*H03M 1/00* (2006.01)
*H04R 3/04* (2006.01)
(Continued)

(52) U.S. Cl.
CPC ............. *H04R 3/04* (2013.01); *H03G 7/007* (2013.01); *H03G 9/005* (2013.01); *H03M 1/00* (2013.01);
(Continued)

(58) Field of Classification Search
CPC ............. H03M 1/00; H03M 1/1225; H03M 2201/4135; H03M 1/12; H04L 27/2647; H04L 1/20
(Continued)

(56) References Cited

U.S. PATENT DOCUMENTS 4,446,440 A    5/1984    Bell
4,972,436 A    11/1990   Halim et al.
(Continued)

FOREIGN PATENT DOCUMENTS

EP    0966105 A2    12/1999
EP    1575164 A2    9/2005
(Continued)

OTHER PUBLICATIONS

Thaden, Rainer et al., A Loudspeaker Management System with FIR/IRR Filtering; AES 32nd International Conference, Hillerod, Denmark, Sep. 21-23, 2007; pp. 1-12.
(Continued)

*Primary Examiner* — Joseph Lauture
(74) *Attorney, Agent, or Firm* — Jackson Walker L.L.P.

(57) ABSTRACT

In accordance with embodiments of the present disclosure, a multichip circuit for processing audio signals having dynamic range enhancement information over two or more integrated circuits may include a host integrated circuit and a client integrated circuit. The host integrated circuit may be configured to determine a dynamic range enhancement gain for a digital audio input signal, process the digital audio input signal in accordance with the dynamic range enhancement gain, and transmit audio data based on the processed digital audio input signal. The client integrated circuit may be coupled to the host integrated circuit and may be configured to receive the audio data and wherein the client integrated circuit is provided with the dynamic range enhancement gain and the client integrated circuit is configured to process the audio data with the dynamic range enhancement gain.

28 Claims, 7 Drawing Sheets

(51) Int. Cl.
*H03G 7/00* (2006.01)
*H03G 9/00* (2006.01)
*H03M 1/12* (2006.01)
*H04L 1/20* (2006.01)
*H04L 27/26* (2006.01)

(52) U.S. Cl.
CPC ............ *H03M 1/12* (2013.01); *H03M 1/1225* (2013.01); *H03M 2201/4135* (2013.01); *H04L 1/20* (2013.01); *H04L 27/2647* (2013.01); *H04R 2430/01* (2013.01); *H04R 2430/03* (2013.01)

(58) Field of Classification Search
USPC ....... 341/139, 141, 132, 155, 163, 120, 118; 375/316, 227
See application file for complete search history.

(56) References Cited

U.S. PATENT DOCUMENTS

| | | | |
|---|---|---|---|
| 4,999,628 A | 3/1991 | Kakubo et al. | |
| 4,999,830 A | 3/1991 | Agazzi | |
| 5,148,167 A | 9/1992 | Ribner | |
| 5,321,758 A | 6/1994 | Charpentier et al. | |
| 5,323,159 A | 6/1994 | Imamura et al. | |
| 5,550,923 A | 8/1996 | Hotvet | |
| 5,600,317 A | 2/1997 | Knoth et al. | |
| 5,714,956 A | 2/1998 | Jahne et al. | |
| 2,810,477 A | 9/1998 | Abraham et al. | |
| 5,808,575 A | 9/1998 | Himeno et al. | |
| 6,088,461 A | 7/2000 | Lin | |
| 6,201,490 B1 | 3/2001 | Kawano et al. | |
| 6,271,780 B1 | 8/2001 | Gong et al. | |
| 6,353,404 B1 | 3/2002 | Kuroiwa | |
| 6,745,355 B1 | 6/2004 | Tamura | |
| 6,768,443 B2 | 7/2004 | Willis | |
| 6,822,595 B1 | 11/2004 | Robinson | |
| 6,853,242 B2 | 2/2005 | Melanson et al. | |
| 6,888,888 B1 | 5/2005 | Tu et al. | |
| 7,020,892 B2 | 3/2006 | Levesque et al. | |
| 7,023,268 B1 | 4/2006 | Taylor et al. | |
| 7,061,312 B2 | 6/2006 | Andersen et al. | |
| 7,167,112 B2 | 1/2007 | Andersen et al. | |
| 7,216,249 B2 | 5/2007 | Fujiwara et al. | |
| 7,403,010 B1 | 7/2008 | Hertz | |
| 7,440,891 B1 | 10/2008 | Shozakai et al. | |
| 7,522,677 B2 | 4/2009 | Liang | |
| 7,583,215 B2 | 9/2009 | Yamamoto et al. | |
| 7,679,538 B2 | 3/2010 | Tsang | |
| 7,893,856 B2 | 2/2011 | Ek et al. | |
| 8,060,663 B2 | 11/2011 | Murray et al. | |
| 8,289,425 B2 | 10/2012 | Kanbe | |
| 8,330,631 B2 | 12/2012 | Kumar et al. | |
| 8,362,936 B2 | 1/2013 | Ledzius et al. | |
| 8,717,211 B2 | 5/2014 | Miao et al. | |
| 8,804,111 B2 * | 8/2014 | Golovanevsky ... | G01N 21/9501 356/237.2 |
| 8,873,182 B2 | 10/2014 | Liao et al. | |
| 8,952,837 B2 | 2/2015 | Kim et al. | |
| 9,071,267 B1 | 6/2015 | Schneider et al. | |
| 9,071,268 B1 | 6/2015 | Schneider et al. | |
| 9,148,164 B1 | 9/2015 | Schneider et al. | |
| 9,306,588 B2 | 4/2016 | Das et al. | |
| 9,337,795 B2 | 5/2016 | Das et al. | |
| 9,391,576 B1 | 7/2016 | Satoskar et al. | |
| 2001/0009565 A1 | 7/2001 | Singvall | |
| 2004/0184621 A1 | 9/2004 | Andersen et al. | |
| 2005/0258989 A1 | 11/2005 | Li et al. | |
| 2005/0276359 A1 | 12/2005 | Xiong | |
| 2006/0056491 A1 | 3/2006 | Lim et al. | |
| 2006/0098827 A1 | 5/2006 | Paddock et al. | |
| 2006/0284675 A1 | 12/2006 | Krochmal et al. | |
| 2007/0057720 A1 | 3/2007 | Hand et al. | |
| 2007/0092089 A1 | 4/2007 | Seefeldt et al. | |
| 2007/0103355 A1 | 5/2007 | Yamada | |
| 2007/0120721 A1 | 5/2007 | Caduff et al. | |
| 2007/0123184 A1 | 5/2007 | Nesimoglu et al. | |
| 2008/0030577 A1 | 2/2008 | Cleary et al. | |
| 2008/0159444 A1 | 7/2008 | Terada | |
| 2009/0021643 A1 | 1/2009 | Hsueh et al. | |
| 2009/0058531 A1 | 3/2009 | Hwang et al. | |
| 2009/0084586 A1 | 4/2009 | Nielsen | |
| 2009/0220110 A1 | 9/2009 | Bazarjani et al. | |
| 2010/0183163 A1 | 7/2010 | Matsui et al. | |
| 2011/0013733 A1 | 1/2011 | Martens et al. | |
| 2011/0025540 A1 | 2/2011 | Katsis | |
| 2011/0063148 A1 | 3/2011 | Kolze et al. | |
| 2011/0096370 A1 | 4/2011 | Okamoto | |
| 2011/0136455 A1 | 6/2011 | Sundstrom et al. | |
| 2011/0150240 A1 | 6/2011 | Akiyama et al. | |
| 2011/0170709 A1 | 7/2011 | Guthrie et al. | |
| 2011/0242614 A1 | 10/2011 | Okada | |
| 2012/0047535 A1 | 2/2012 | Bennett et al. | |
| 2012/0133411 A1 | 5/2012 | Miao et al. | |
| 2012/0177201 A1 | 7/2012 | Ayling et al. | |
| 2012/0177226 A1 | 7/2012 | Silverstein et al. | |
| 2012/0188111 A1 | 7/2012 | Ledzius et al. | |
| 2012/0207315 A1 | 8/2012 | Kimura et al. | |
| 2012/0242521 A1 | 9/2012 | Kinyua | |
| 2012/0250893 A1 | 10/2012 | Carroll et al. | |
| 2012/0263090 A1 | 10/2012 | Porat et al. | |
| 2012/0280726 A1 | 11/2012 | Colombo et al. | |
| 2013/0106635 A1 | 5/2013 | Doi | |
| 2013/0188808 A1 | 7/2013 | Pereira et al. | |
| 2014/0105256 A1 | 4/2014 | Hanevich et al. | |
| 2014/0105273 A1 | 4/2014 | Chen et al. | |
| 2014/0135077 A1 | 5/2014 | Leviant et al. | |
| 2014/0184332 A1 | 7/2014 | Shi et al. | |
| 2014/0269118 A1 | 9/2014 | Taylor et al. | |
| 2015/0214974 A1 | 7/2015 | Currivan | |
| 2015/0214975 A1 | 7/2015 | Gomez et al. | |
| 2015/0295584 A1 | 10/2015 | Das et al. | |
| 2015/0381130 A1 | 12/2015 | Das et al. | |
| 2016/0072465 A1 | 3/2016 | Das et al. | |
| 2016/0080862 A1 | 3/2016 | He et al. | |
| 2016/0080865 A1 | 3/2016 | He et al. | |
| 2016/0173112 A1 | 6/2016 | Das et al. | |

FOREIGN PATENT DOCUMENTS

| | | |
|---|---|---|
| EP | 1753130 A1 | 2/2007 |
| EP | 1798852 A2 | 6/2009 |
| EP | 2207264 A1 | 7/2010 |
| GB | 1599401 A | 9/1981 |
| GB | 2119189 A | 11/1983 |
| GB | 2307121 A | 6/1997 |
| GB | 2507096 A | 4/2014 |
| GB | 2527637 A | 12/2015 |
| JP | 2008294803 A | 12/2008 |
| WO | WO0054403 A1 | 9/2000 |
| WO | 02/37686 A2 | 5/2002 |
| WO | 2008067260 A1 | 6/2008 |
| WO | 2014113471 A1 | 7/2014 |
| WO | 2015160655 | 10/2015 |
| WO | 2016040165 A1 | 3/2016 |
| WO | 2016040171 A1 | 3/2016 |
| WO | 2016040177 A1 | 3/2016 |

OTHER PUBLICATIONS

Thaden, Rainer et al., A Loudspeaker Management System with FIR/IRR Filtering; Slides from a presentation given at the 32nd AES conference "DSP for Loudspeakers" in Hillerod, Denmark in Sep. 2007; http://www.four-audio.com/data/AES32/AES32FourAudio.pdf; 23 pages.
GB Patent Application No. 1419651.3, Improved Analogue-to-Digital Convertor, filed Nov. 4, 2014, 65 pages.
Combined Search and Examination Report, GB Application No. GB1506258.1, Oct. 21, 2015, 6 pages.

(56) References Cited

OTHER PUBLICATIONS

International Search Report and Written Opinion, International Patent Application No. PCT/US2015/025329, mailed Aug. 11, 2015, 9 pages.
International Search Report and Written Opinion, International Patent Application No. PCT/US2015/048633, mailed Dec. 10, 2015, 11 pages.
International Search Report and Written Opinion, International Patent Application No. PCT/US2015/048591, mailed Dec. 10, 2015, 11 pages.
Combined Search and Examination Report, GB Application No. GB1510578.6, Aug. 3, 2015, 3 pages.
International Search Report and Written Opinion, International Application No. PCT/US2015/056357, mailed Jan. 29, 2015, 13 pages.
Combined Search and Examination Report, GB Application No. GB1514512.1, Feb. 11, 2016, 7 pages.
International Search Report and Written Opinion, International Application No. PCT/US2015/048609, mailed Mar. 23, 2016, 23 pages.
International Search Report and Written Opinion, International Application No. PCT/US2016/022578, mailed Jun. 22, 2016, 12 pages.
Combined Search and Examination Report, GB Application No. GB1600528.2, Jul. 7, 2016, 8 pages.
Combined Search and Examination Report, GB Application No. GB16036287, Aug. 24, 2016, 6 pages.
International Search Report and Written Opinion, International Application No. PCT/EP2016/062862, mailed Aug. 26, 2016, 14 pages.

\* cited by examiner

MULTICHIP DYNAMIC RANGE ENHANCEMENT (DRE) AUDIO PROCESSING METHODS AND APPARATUSES

FIELD OF DISCLOSURE

The field of representative embodiments of this disclosure relates to audio processing methods, apparatuses, or implementations, and, more particularly, to multichip dynamic range enhancement ("DRE") audio processing methods, apparatuses, and implementations.

BACKGROUND

Audio processing methods, apparatuses, and implementations for processing digital audio input signals into analog audio output signals can be implemented or provided on a single integrated circuit ("IC") and include a way(s) for enhancing the dynamic range (e.g., a dynamic range enhancement ("DRE") feature/capability) of audio signals processed by the single IC. Such a DRE solution/controller is typically provided and confined within the single audio processing IC.

FIG. 1 shows an example single DRE audio processing IC 100 in accordance with the prior art. Single IC 100 comprises a path that has coupled in series a signal processing block 104, a DRE gain block 105 having a DRE gain 106, a modulator 108, a digital-to-analog converter ("DAC") 110, and a driver 112 having a driver gain 116 as shown in FIG. 1. An audio input signal ("AUDIO IN") 102 is received by single IC 100 and is fed into signal processing block 104. Single IC 100 provides an audio output signal ("AUDIO OUT") 118 as the output. A DRE control block 114 is coupled to the output of signal processing block 104, and the output of DRE control block 114 is fed into the DRE gain block 105. Depending upon the criteria or manner of the DRE control, DRE control block 114 gains up or gains down the DRE gain 106 of DRE gain block 105. The product of the DRE gain 106 and the driver gain 116 may always equal one or another constant value, so the driver gain 116 is correspondingly gained down or gained up based on the respective gain up or gain down of DRE gain 106 (e.g., driver gain 116 is the inverse of DRE gain 106).

FIG. 2 shows an example audio device configuration 200 in accordance with the prior art. Audio device configuration 200 shows a mobile device or computer 202 having an earphone or headphone 201 coupled to it. The single IC 100 is located within mobile device or computer 202. In this example configuration 200, the audio processing that includes the conversion of the digital signals into analog signals and the DRE control of the audio signals are all done within the single IC 100. Thus, the earphone/headphone 201 receives the already processed and DRE controlled analog output signals 203 and 205 from mobile device or computer 202, and the analog output signals 203 and 205 are transmitted to respective earbuds or headphone speakers 204 and 206 as shown in FIG. 2.

FIG. 3 shows another example audio device configuration 300 in accordance with the prior art. Configuration 300 is similar to configuration 200 of FIG. 2, but in configuration 300, the single IC 100 is located in an external box 302 as shown in FIG. 3 instead of within mobile device or computer 202 as shown in FIG. 2. Configuration 300 shows the mobile device or computer 202 coupled to the external box 300. The mobile device or computer 202 provides an analog or digital audio signal 301 to external box 302. External box 302 is coupled to earphone or headphone 201, and external box 302, in turn, provides the analog output signals 203 and 205 to respective earbuds or headphone speakers 204 and 206 as shown in FIG. 3. Similar to configuration 200, since analog output signals 203 and 205 are being provided to the earbuds or headphone speakers 204 and 206 in configuration 300 of FIG. 3, power again is required for enabling such analog signal transmission through earphone or headphone 201. This power is typically provided by the battery or power storage unit of the mobile device or computer 202 or by a battery or power storage unit of the external box 302 if the external box 302 has such a battery or power storage unit. This power consumption of the battery or power storage unit of the mobile device or computer 202 and/or external box 302 is not desired.

Adaptive noise cancellation ("ANC") algorithms are well known in the art and have been implemented for processing audio signals (e.g., AUDIO IN 102) in effectively cancelling or filtering ambient or background noise. In ANC processing, there is a desire to place ANC microphones as close to a user's ear as possible. ANC microphones are typically located in the mobile device or computer 202 of FIGS. 2 and 3 or in the external box 302 of FIG. 3 since they at least require a level of signal processing hardware/circuitry that is typically located in the mobile device, computer, or external box. An ANC microphone would be ideally located in an earbud/headphone speaker 204 or 206. However, locating an ANC microphone in an earbud/headphone speaker 204 or 206 has its challenges. Such challenges include but are not limited to space limitations and/or processing requirements. Thus, digital processing/communications for such ANC microphone signals has advantages and would be desired.

Thus, a number of desired reasons exist for processing audio signals as digital signals instead of analog signals. Some of these desired reasons include but are not limited to providing higher fidelity, lessening susceptibility to noise, interference and coupling effects, lessening degradation of signals along the transmission path, allowing for more sophisticated error correction algorithms, and maybe even lowering power consumption.

SUMMARY

In accordance with the teachings of the present disclosure, one or more disadvantages and problems associated with existing approaches to avoiding signal distortion in a signal processing system may be reduced or eliminated.

In accordance with embodiments of the present disclosure, a multichip circuit for processing audio signals having dynamic range enhancement information over two or more integrated circuits may include a host integrated circuit and a client integrated circuit. The host integrated circuit may be configured to determine a dynamic range enhancement gain for a digital audio input signal, process the digital audio input signal in accordance with the dynamic range enhancement gain, and transmit audio data based on the processed digital audio input signal. The client integrated circuit may be coupled to the host integrated circuit and may be configured to receive the audio data and wherein the client integrated circuit is provided with the dynamic range enhancement gain and the client integrated circuit is configured to process the audio data with the dynamic range enhancement gain.

In accordance with these and other embodiments of the present disclosure, a host integrated circuit for use in a multichip circuit for processing audio signals having dynamic range enhancement information over two or more integrated circuits may include a host controller and a transmitter. The host controller may be configured to determine a dynamic range enhancement gain for a digital audio input signal and process the digital audio input signal in accordance with the dynamic range enhancement gain. The transmitter may be configured to transmit audio data based on the processed digital audio input signal to a client integrated circuit coupled to the host integrated circuit, such that the client integrated circuit is provided with the dynamic range enhancement gain in order to process the audio data with the dynamic range enhancement gain.

In accordance with these and other embodiments of the present disclosure, a client integrated circuit for use in a multichip circuit for processing audio signals having dynamic range enhancement information over two or more integrated circuits may include a receiver and a client controller. The receiver may be configured to receive audio data from a host integrated circuit in accordance with the dynamic range enhancement gain. The client controller may be configured to determine a dynamic range enhancement gain for a digital audio input signal and process the audio data in accordance with the dynamic range enhancement gain.

In accordance with these and other embodiments of the present disclosure, a method for processing audio signals having dynamic range enhancement information over two or more integrated circuits may include processing, by a host integrated circuit, a digital audio input signal. The method may also include determining, by the host integrated circuit, a dynamic range enhancement gain for the digital audio input signal. The method may further include transmitting audio data based on the processed digital audio input signal. The method may additionally include receiving, by the client integrated circuit, the audio data. The method may also include providing the dynamic range enhancement gain to the host integrated circuit and the client integrated circuit. The method may further include processing, by the client integrated circuit, the audio data with the dynamic range enhancement gain.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Embodiments of the present disclosure may provide the processing of audio signals with dynamic range enhancement ("DRE") data/information among at least two or more integrated circuits ("ICs"). The audio signals with the DRE data/information may be processed so that the communication between or among the two or more ICs may be accomplished or done digitally (e.g., digital communication between or among the two or more ICs). The DRE data/information for the audio signals may be provided to the two or more ICs. Various ways of providing the DRE data/information to the ICs may be provided in the embodiments of the present disclosure. Other data or information, such as adaptive noise cancellation ("ANC") data or information, can also be provided or processed and digitally communicated between or among the two or more ICs too. The embodiments of the present disclosure may have the advantage of eliminating or reducing analog communication between two or more devices that process and/or transmit audio signals, and instead provide a way of digitally communicating between two or more devices (e.g., providing digital link communications). Thus, the embodiments of the present disclosure may provide the desired advantages of digital communication/processing across two or more devices over analog signal communication/processing. Such example desired advantages were previously discussed and mentioned in the background section.

Figure 1:
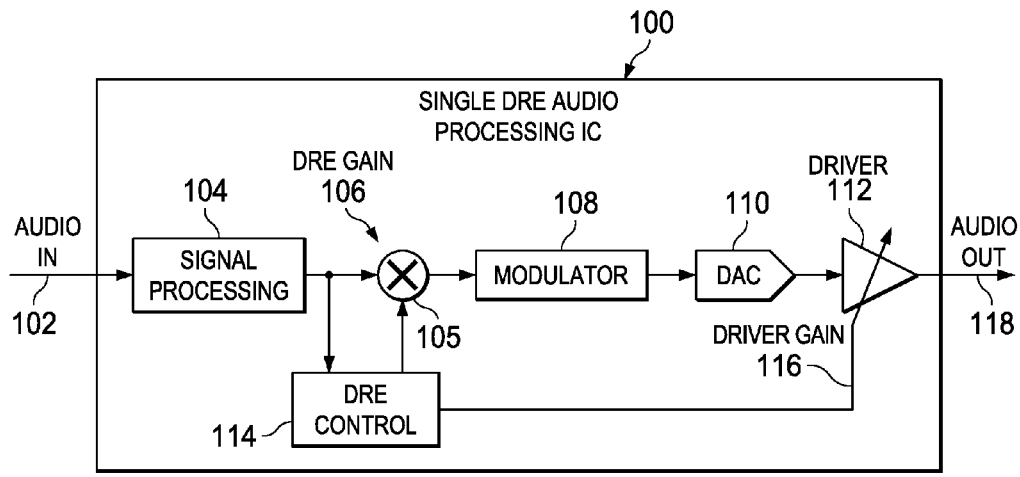
FIG. 1 illustrates a block diagram of an example audio processing integrated circuit, in accordance with existing art.
Figure 2:
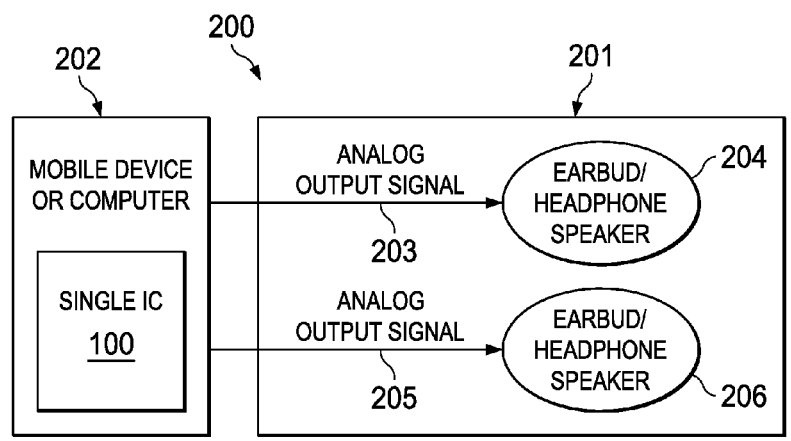
FIG. 2 illustrates a block diagram of an example audio device configuration, in accordance with existing art.
Figure 3:
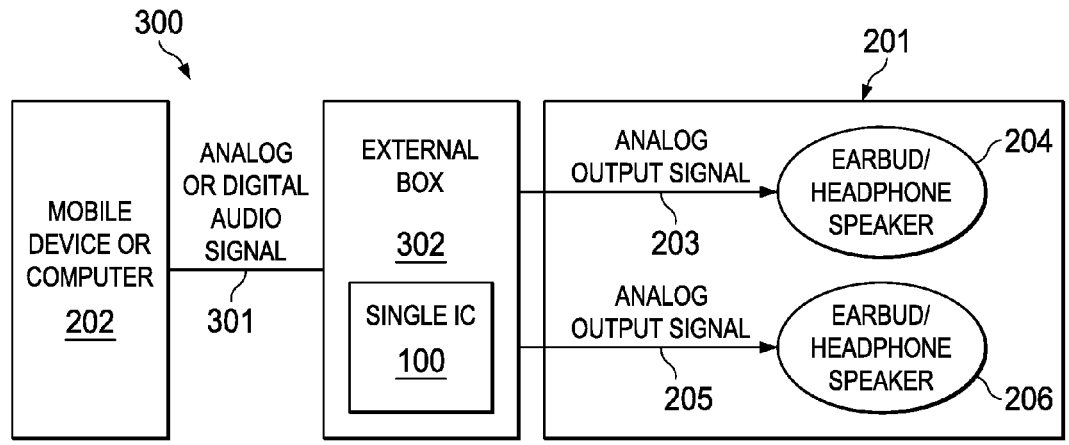
FIG. 3 illustrates a block diagram of another example audio device configuration, in accordance with existing art.
Figure 4B:
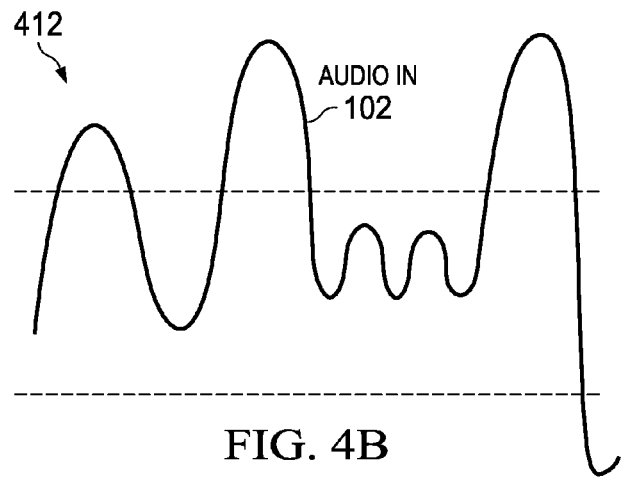
FIG. 4B illustrates an example graph of a waveform for an example, sample audio input signal, in accordance with embodiments of the present disclosure.
Figure 4C:
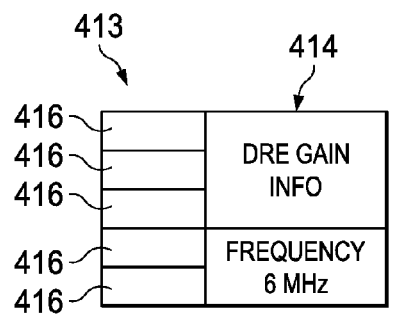
FIG. 4C illustrates an example data format for digital data, in accordance with embodiments of the present disclosure.
Figure 4A:
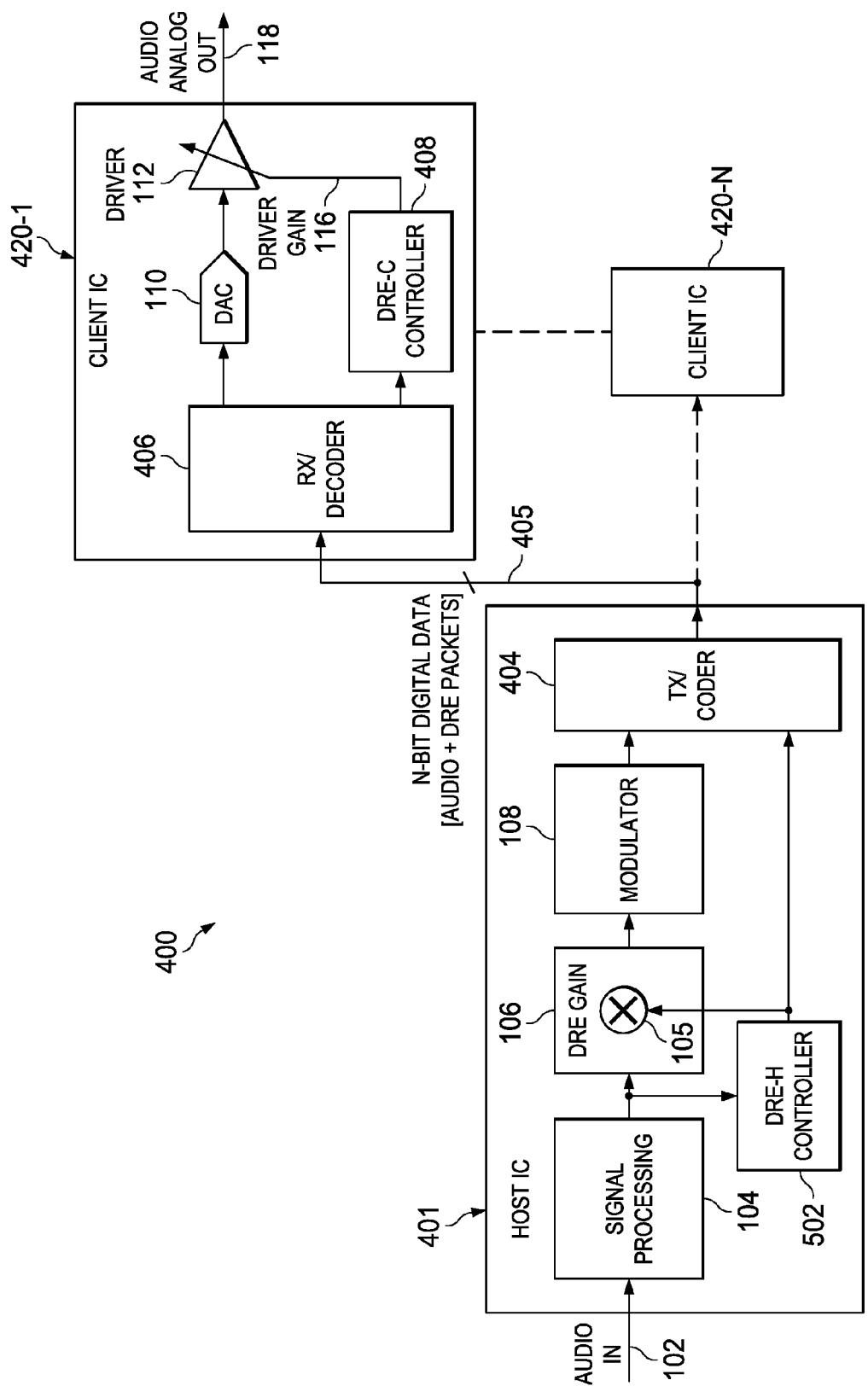
FIG. 4A illustrates a block diagram of an example multichip or multi-integrated circuit audio processing configuration, in accordance with embodiments of the present disclosure.

A first example multichip or multi-IC audio processing configuration 400 according to the present disclosure is shown in FIG. 4A. Configuration 400 shows a host IC 401 that may digitally communicate with one or more client IC(s) 420-1 ... 420-N (e.g., N number of client ICs) wherein N is an integer that is one or greater. The processing of audio signals may be divided or split among or between the host IC 401 and the one or more client ICs 420-1 ... 420-N. The digital communication among or between the host IC 401 and one or more client ICs 420-1 . . . 420-N may eliminate or reduce the analog communication that would otherwise consume power between two or more devices or device components.

Host IC 401 may have a path that has coupled in series a signal processing block 104, a DRE gain block 105 having a DRE gain 106, a modulator 108, and a transmitter/coder (TX/CODER) block 404 as shown in FIG. 4A. The signal processing block 104 may include interpolators, sample/hold blocks and/or sample rate converters. The modulator 108 may be a delta-sigma modulator. A DRE host controller (DRE-H controller) 402 may be coupled to signal processing block 104 as shown in FIG. 4A and may have an input that receives the output of signal processing block 104. The DRE host controller 402 may be coupled to the DRE gain block 105 and TX/CODER block 404 as shown in FIG. 4A and may provide its output to both the DRE gain block 105 and TX/CODER block 404.

The TX/CODER block 404 may be a transmitter with an optional coder/serializer that codes the audio data (e.g., for digital transmission/communication) as well as the DRE gain information into digital data format. For example, the TX/CODER block 404 may code the audio information into N-bit digital data 405 wherein N is an integer of one or greater. In example configuration 400, the N-bit digital data 405 may comprise at least datagrams that have the audio and DRE information coded in digital form (e.g., AUDIO+DRE datagrams). An AUDIO datagram may comprise the digital audio content for digital data that may have been modulated by the modulator 108. A DRE datagram may have the DRE information for the respective AUDIO datagram and may identify the gain (e.g., DRE gain) applied to the digital data stream that is stored in the corresponding AUDIO datagram.

The DRE-H controller 402 may receive a processed audio input signal (based on audio input signal 102) from signal processing block 104. The DRE-H controller 402 may monitor the audio input signal 102 and determine when to apply a DRE gain 106 to the audio input signal 102. The DRE-H controller 402 may also determine how much of a DRE gain 106 to apply to the audio input signal 102. Based on characteristics of the audio input signal 102, the DRE-H controller 402 may adjust a DRE gain 106 at DRE gain block 105. Example characteristics of audio input signal 102 may include but are not limited to monitoring threshold detection, peak detection, peak and/or envelope tracking of the audio input signal 102. FIG. 4B is an example signal diagram 412 that shows an example, sample audio input ("AUDIO IN") signal 102. Depending on threshold detection, peak detection, peak tracking and/or envelope tracking for an audio data segment of audio input signal 102 that is being processed, a respective DRE gain may be assigned and provided for the corresponding digital data stream for that audio data segment being processed. A number of ways may exist for determining the DRE gain for a data stream. For instance, example ways of such DRE gain determination is disclosed in the following patent applications assigned to Cirrus Logic, Inc.: U.S. patent application Ser. No. 14/083,972 entitled "Enhancement of Dynamic Range of Audio Signal Path" (Inventors: Andy Satoskar, Dan Allen, and Teju Das) filed on Nov. 19, 2013 (Cirrus Docket No. 2101 and hereafter "the '972 patent application"), U.S. Patent Application No. 14/467,969 entitled "Reducing Audio Artifacts in a System for Enhancing Dynamic Range of Audio Signal Path" (Inventors: Teju Das, Ku He, and John Melanson) filed on Aug. 25, 2014 (Cirrus Docket No. 2207 and hereafter "the '969 patent application"), U.S. patent application Ser. No. 14/483,659 entitled "Systems and Methods for Reduction of Audio Artifacts in an Audio System with Dynamic Range Enhancement" (Inventors: Ku He, Teju Das, and John Melanson) filed on Sep. 11, 2014 (Cirrus Docket No. 2210 and hereafter "the '659 patent application"), and U.S. patent application Ser. No. 14/507,372 entitled "Systems and Methods for Reduction of Audio Artifacts in an Audio System with Dynamic Range Enhancement" (Inventors: Ku He, Teju Das, and John Melanson) filed on Oct. 6, 2014 (Cirrus Docket No. 2210-C1 and hereafter "the '372 patent application"). The '972 patent application, the '969 patent application, the '659 patent application, and the '372 patent application are hereby incorporated by reference.

N-bit digital data 405 may have a data format, such as, for example, the example data format 413 shown in FIG. 4C. Data format 413 may be structured so that there can be N number of bits 416 for the audio data or AUDIO datagram (wherein N is an integer of one or greater) and a bit(s) or a value(s) 414 that represents the DRE gain information. Data format 413 may also include an associated frequency which is the rate at which the digital data 405 is transmitted or communicated from host IC 401 to each of the client ICs 420-1 . . . 420-N via communication links between the ICs. In FIG. 4C, N-bit digital data 405 may be transmitted from TX/CODE 404 of host IC 401 to each of the client ICs 420-1 . . . 420-N via the respective communication links.

Each client IC (e.g., client IC 420-1 . . . 420-N) may include a receiver/decoder (RX/DECODER) block 406, a digital-to-analog converter ("DAC") 110, and a driver 112 having a driver gain 116 coupled together in series in the manner shown in FIG. 4A. RX/DECODER block 406 may be a receiver with an optional decoder/de-serializer. The DAC 110 may be any suitable DAC, including but not limited to a switched-capacitor DAC, a current-mode DAC, or a resistive DAC. Driver 112 may be any suitable driver, including but not limited to a Class-AB driver/amplifier or a Class-D driver/amplifier. For configuration 400, the RX/DECODER block 406 may decode N-bit digital data 405 into audio signal information that includes both the audio data content as well as the DRE gain information. A DRE client controller ("DRE-C controller") 408 may receive as its input the audio signal information (e.g., audio data content and the DRE gain information) from RX/DECODER block 406 and may provide an output to driver 112 to control/adjust the driver gain 116 based on the DRE gain information. DRE-C controller 408 may control/adjust the driver gain 116 in a manner so that the product of the DRE gain 106 in host IC 401 and the driver gain 116 in each client IC 420-1 . . . 420-N may always equal one or another constant value. In other words, the DRE-C controller 408 may apply a driver gain 116 that is equal to an inverse gain of the DRE gain 106. Driver 112 may then drive and output a corresponding audio analog output ("AUDIO ANALOG OUT") signal 118. In some embodiments, the digital and analog gains may be aligned in time to prevent audio artifacts from being driven to the output by driver 112. Example systems and methods for aligning digital and analog gains may be found in the '969 patent application and the '659 patent application.

Figure 5:
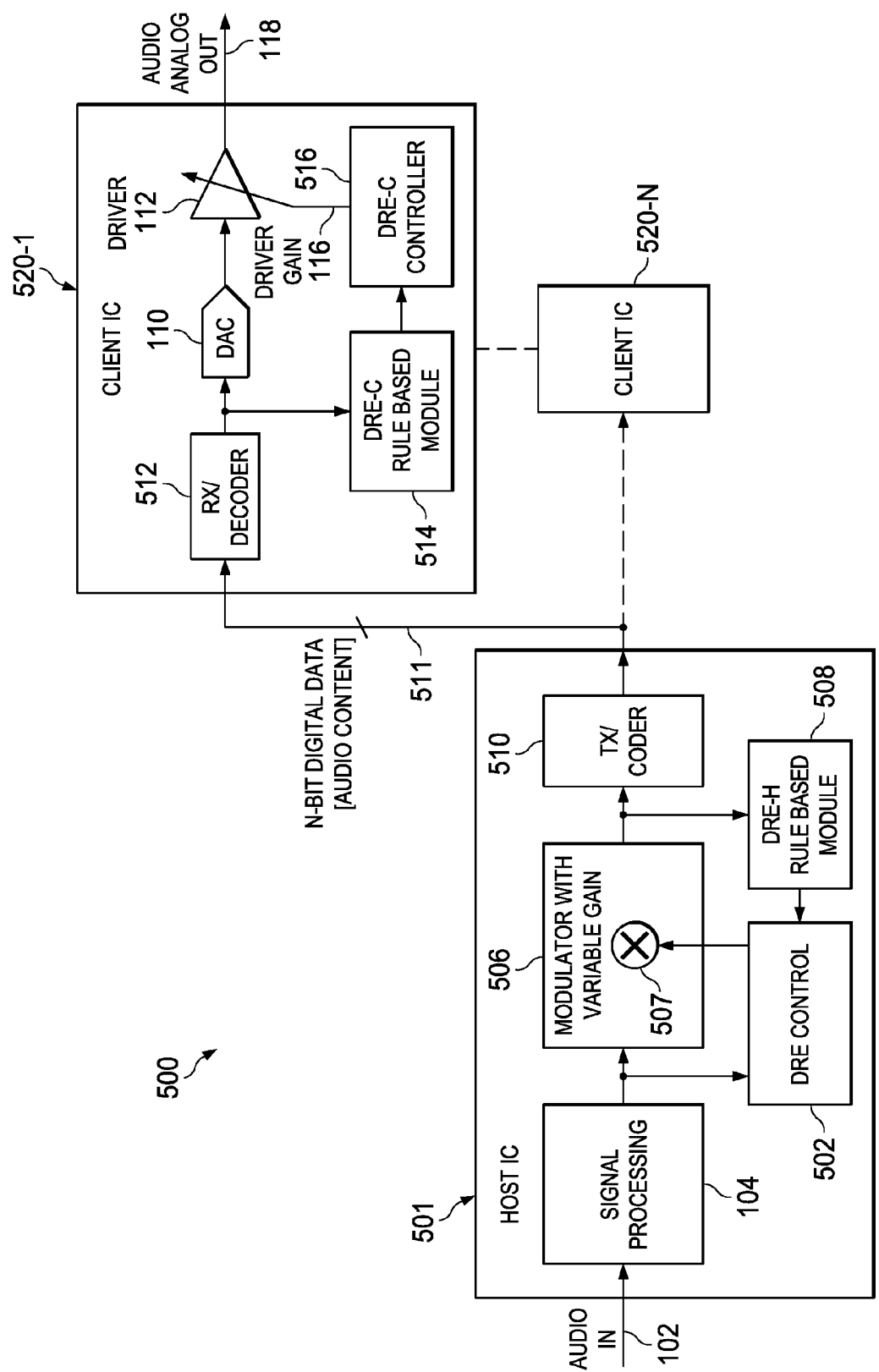
FIG. 5 illustrates a block diagram of another example multichip or multi-integrated circuit audio processing configuration, in accordance with embodiments of the present disclosure.

A second example multichip or multi-IC audio processing configuration 500 according to the present disclosure is shown in FIG. 5. Configuration 500 may be similar to configuration 400 except that in configuration 500, N-bit digital data 511 that may be transmitted/communicated between the host IC 501 and the client IC(s) 520-1 . . . 520-N may only include the audio content or audio data (e.g., AUDIO datagram) and not the DRE gain information (e.g., the DRE datagram). Instead, the DRE gain information used in host IC 501 may be provided to or derived by the client ICs 520-1 . . . 520-N in a different manner. The transmission or communication of only the audio data (e.g., AUDIO datagram) as shown in configuration 500 may be desirable because configuration 400 that transmits/communicates both the audio data and DRE information (e.g., AUDIO and DRE datagrams) would require more bandwidth for the communication links between the host IC and the client IC(s), require more complex digital data processing (such as for coding/decoding the digital data being communicated/transmitted), and generally consume more power than configuration 500.

Configuration 500 shows a host IC 501 that may digitally communicate with one or more client IC(s) 520-1 . . . 520-N (e.g., N number of client ICs) wherein N is an integer that is one or greater. The processing of audio signals may also be divided or split among or between the host IC 501 and the one or more client ICs 520-1 . . . 520-N. The digital communication among or between the host IC 501 and one or more client ICs 520-1 . . . 520-N may eliminate or reduce the analog communication that would otherwise consume power between two or more devices or device components.

Host IC 501 may have a path that has coupled in series a signal processing block 104, a modulator with variable gain block 506, and a transmitter/coder (TX/CODER) block 510 as shown in FIG. 5. The signal processing block 104 may include interpolators, sample/hold blocks and/or sample rate converters. A DRE host controller (DRE-H controller) 502 may be coupled to signal processing block 104, modulator with variable gain block 506, and DRE host rule based module (DRE-H Rule Based Module) 508 as shown in FIG. 5. DRE-H controller 502 may have an input that receives the output of signal processing block 104 and another input that receives the output of DRE-H Rule Based Module 508. The DRE-H controller 502 may also monitor the audio input signal 102 and the output of the DRE-H Rule Based Module 508 to make the DRE gain decisions that determine the variable gain (e.g., DRE gain) 507 applied to an audio signal. The variable gain (e.g., DRE gain) 507 for modulator with variable gain block 506 may change a gain of a quantizer of a delta-sigma modulator and/or change a gain of all feedback coefficients of the delta-sigma modulator to keep the loop characteristics unchanged.

The TX/CODER block 510 may be a transmitter with an optional coder/serializer that codes the audio data into digital data format. For example, the TX/CODER block 510 may code the audio information into N-bit digital data 511 wherein N is an integer that is one or greater. In example configuration 500, the N-bit digital data 511 may include at least datagrams that have the audio information coded in digital form (e.g., AUDIO datagrams). An AUDIO datagram may include the digital audio content for a digital data stream.

The DRE-H Rule Based Module 508 may set certain rules to modify the variable gain (e.g., DRE gain) 507 based on the output data of modulator with variable gain block 506. Example rule based algorithms or methods include but are not limited to looking for specific bit patterns or certain most-significant-bits (MSBs) or certain least-significant-bits (LSBs) being a zero or one for a specific amount of time. Modulator with variable gain block 506 may send its output to DRE-H controller 502, and DRE-H controller 502 may change or adjust the variable gain (e.g., DRE gain) 507 based on the set rules such that the product of the variable gain (e.g., DRE gain) 507 for the host IC 501 and each of the driver gain 116 of the client IC(s) 520-1 . . . 520-N equals one or another constant value.

In FIG. 5, N-bit digital data 511 may be transmitted from TX/CODE 510 of host IC 501 to each of the client ICs 520-1 . . . 520-N via respective communication links. Each client IC (e.g., client IC 520-1 . . . 520-N) may have a receiver/decoder (RX/DECODER) block 512, a digital-to-analog converter ("DAC") 110, and a driver 112 having a driver gain 116 coupled together in series in the manner shown in FIG. 5. RX/DECODER block 512 may be a receiver with an optional decoder/de-serializer. DAC 110 may be any suitable DAC, including but not limited to a switched-capacitor DAC, a current-mode DAC, or a resistive DAC. Driver 112 may be any suitable driver, including but not limited to a Class-AB driver/amplifier or a Class-D driver/amplifier. The RX/DECODER block 512 may decode the N-bit digital data 511 into audio signal information that includes the audio data content. A DRE client rule based module ("DRE-C Rule Based Module") 514 may receive as its input the audio signal information (e.g., audio data content) from RX/DECODER block 512 and may provide an output to a DRE client controller ("DRE-C controller") 516. DRE-C Rule Based Module 514 of client ICs 520-1 . . . 520-N may set the same or similar certain rules that DRE-H Rule Based Module 508 used to control/adjust the driver gain 116 of driver 112. The same certain rules set by DRE-C Rule Based Module 514 may be the example rule based algorithms or methods used by DRE-H Rule Based Module 508. These example rule based algorithms or methods again include but are not limited to looking for specific bit patterns or certain most-significant-bits (MSBs) or certain least-significant-bits (LSBs) being a zero or one for a specific amount of time. DRE-C controller 516 may control/adjust the driver gain 116 based on the certain rules set by DRE-C Rule Based Module 514 in a manner so that the product of the variable gain (e.g., DRE gain) 507 in host IC 501 and the driver gain 116 in each client IC 520-1 . . . 520-N may always equal one or another constant value. In other words, DRE-C controller 516 may apply a driver gain 116 that is equal to an inverse gain of the variable gain (e.g., DRE gain) 507. The driver 112 may then drive and output a corresponding audio analog output ("AUDIO ANALOG OUT") signal 118. Configuration 500 may require less bandwidth, complexity, and power consumption than configuration 400 because configuration 500 may not transmit, communicate, and/or process the DRE information through the communication links between the host and client ICs.

Figure 6:
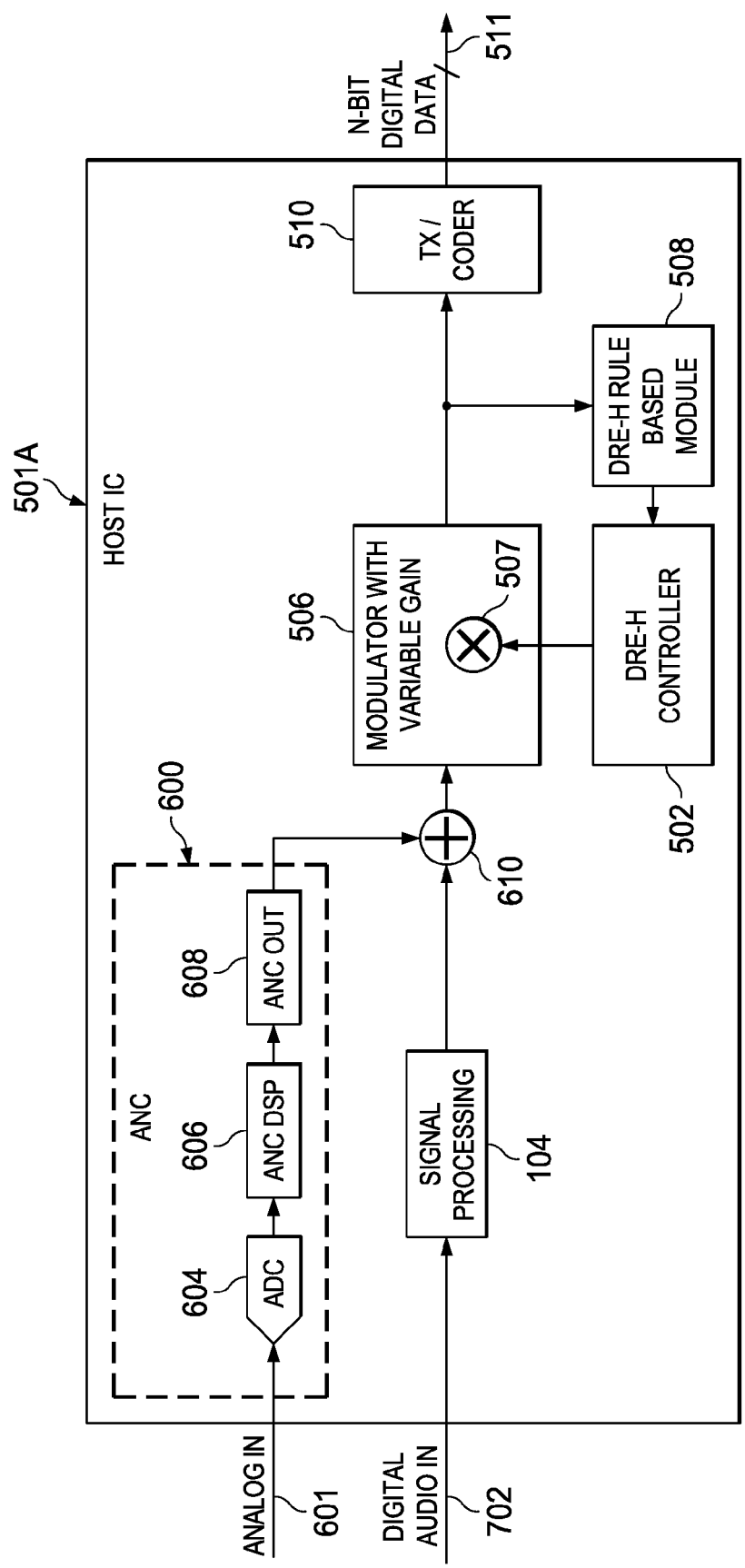
FIG. 6 illustrates an example host integrated circuit which may be used alternatively to the host integrated circuit depicted in FIG. 5, in accordance with embodiments of the present disclosure.

FIG. 6 shows a host IC 501A that may be an alternative to host IC 501 of FIG. 5. Host IC 501A of FIG. 6 may be almost identical to host IC 501 of FIG. 5, so only differences will be discussed. Host IC 501A may add the processing of adaptive noise cancellation ("ANC") to the audio input signals. Host IC 501A shows the addition of adaptive noise cancellation ("ANC") block 600. ANC block 600 may receive an analog input signal 601. ANC block 600 may comprise an analog-to-digital converter ("ADC") block 604, a digital signal processing ("DSP") block 606, and an ANC output block 608 coupled together in series as shown in FIG. 6. A summer block 610 may be coupled between the output of signal processing block 104 and the input to modulator with variable gain block 506 having variable gain 507. The summer block 610 may receive as its inputs the output of signal processing block 104 and the output of ANC block 600 and may provide its output to modulator with variable gain block 506. The DRE-H controller 502 in host IC 501A may be coupled to the other circuit blocks in the similar manner as shown in host IC 501 of FIG. 5 except that in FIG.

6, the DRE-H controller 502 of host IC 501A may not receive as one of its inputs the output of the signal processing block 104. The ANC processed audio signal based on analog input signal 601 and the DRE processed audio signal based on digital audio input signal 102 may be gained at the same amount of variable gain 507 set by DRE-H Rule Based Module 508. Furthermore, the gain at the respective client IC(s) may be gained inversely at the same amount of variable gain 507 for the ANC and DRE processed audio signals.

Figure 7:
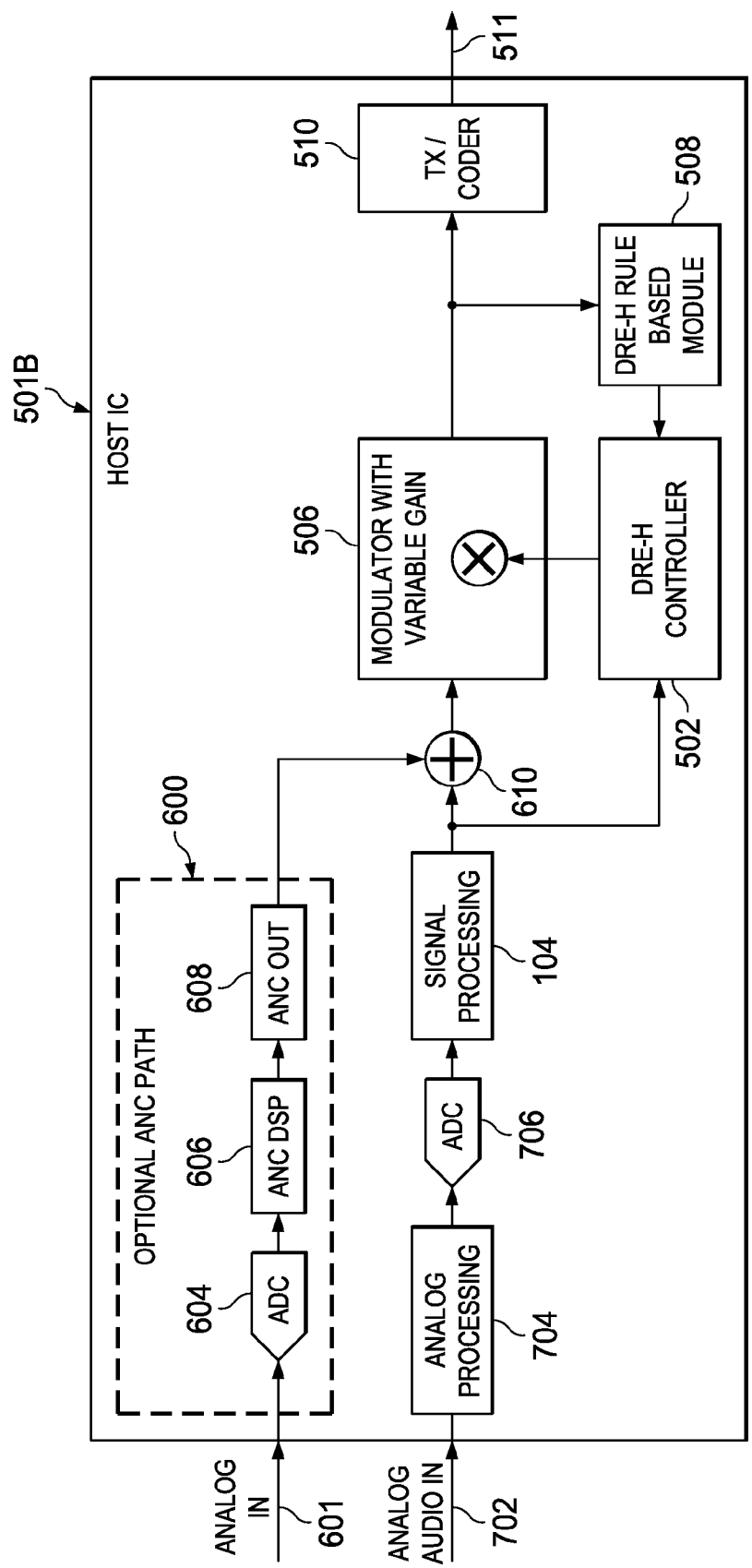
FIG. 7 illustrates another example host integrated circuit which may be used alternatively to the host integrated circuit depicted in FIG. 5, in accordance with embodiments of the present disclosure.

FIG. 7 shows a host IC 501B that may also be an alternative to host IC 501 of FIG. 5. Host IC 501B of FIG. 7 may be almost identical to host IC 501A of FIG. 6, so only differences will be discussed. Host IC 501B may make the ANC block 600 having the ANC path be optional wherein ANC block 600 may receive the analog input signal 601. Host IC 501B may receive an analog audio input 702 instead of a digital audio input 102 that host 501A receives. Because host IC 501B receives an analog audio input 702, host IC 501B may have at its input an additional analog processing block 704 and an analog-to-digital block 706 coupled in series before the signal processing block 104 as shown in FIG. 7. The DRE-H controller 502 in host IC 501B may also receive as one of its inputs the output of signal processing block 104.

Figure 8:
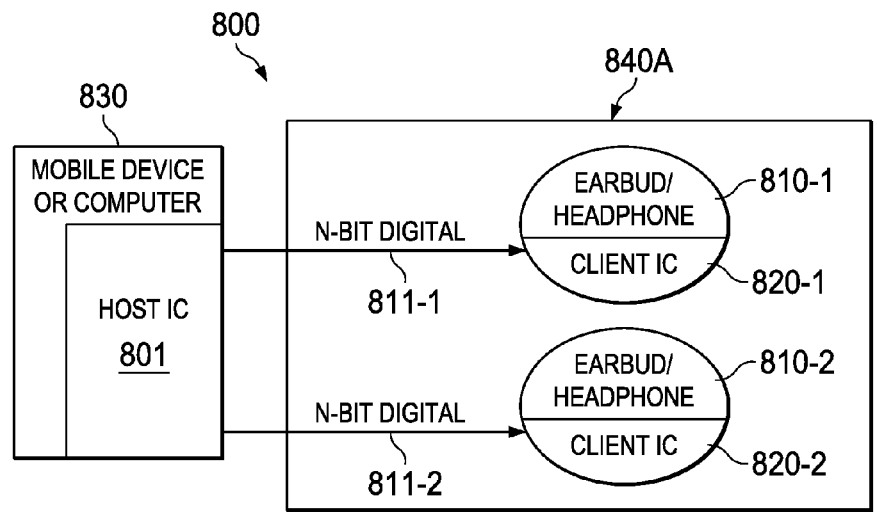
FIG. 8 illustrates an example application configuration for using and applying the methods and system disclosed in FIGS. 4A-7, in accordance with embodiments of the present disclosure.

FIG. 8 shows an example application configuration 800 for using and applying embodiments of the present disclosure. Configuration 800 shows a mobile device or computer 830 that may have a pair of earphones/headphones 840A coupled to it. In application configuration 800, host IC 801 may be located in mobile device or computer 830. Earphones/headphones 840A may have digital wire communication links that transmit N-bit digital data 811-1 and 811-2 respectively to its earbuds/headphone speakers 810-1 and 810-2. Earbuds/headphone speakers 810-1 and 810-2 may have respective client ICs 820-1 and 820-2 inside of them as shown in FIG. 8. In applying the configuration 400 of FIG. 4 to the application configuration 800, host IC 801 may comprise host IC 401 while the client ICs 820-1 and 820-2 may comprise two of the client ICs 420-1 . . . 420-N. In applying configuration 500 of FIG. 5 to the application configuration 800, host IC 801 may comprise host IC 501 while the client ICs 820-1 and 820-2 may comprise two of the client ICs 520-1 . . . 520-N. If host IC 501A or 501B, that adds the ANC processing to the audio signals, are used for host IC 801 instead of host IC 501, then the ANC processing of the analog input signal 601 may be performed within the mobile device or computer 830 (or there will be no ANC in the system).

Figure 9:
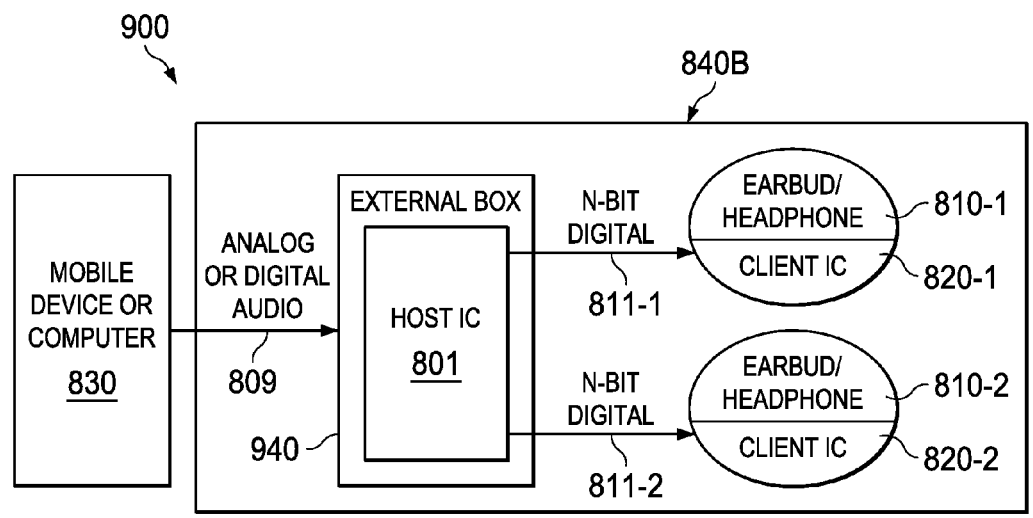
FIG. 9 illustrates another example application configuration for using and applying the methods and system disclosed in FIGS. 4A-7, in accordance with embodiments of the present disclosure.

FIG. 9 shows another example application configuration 900 for using and applying embodiments of the present disclosure. Example application configuration 900 may be very similar to application configuration 800, so only the differences will be discussed. Instead of the host IC 801 being located within the mobile device or computer 830, configuration 900 shows that the host IC 801 may be located in an external box 940 that is part of the pair of earphones/headphones 840B. The mobile device or computer 830 may output an audio signal 809 through an audio signal path to external box 940 as shown in FIG. 9. Configurations 400 and 500 may be applied to application configuration 900 in the same manner that they apply to application configuration 800. However, audio signal 809 may also be an analog signal. If audio signal 809 is an analog signal, then host IC 501B may be used as host IC 801 within external box 940. On the other hand, if audio signal 809 is a digital signal, then host IC 501A may be used as host IC 801 within the external box 940.

Because configurations 800 and 900 may provide communications/transmission paths to and from the earbuds/headphone speakers 810-1 and 810-2 that are digital communications/transmission paths, the signals between the earbuds/headphone speakers 810-1 and 810-2 and the mobile device or computer 830 and/or the external box 940 may still be digital. Thus, if an ANC algorithm is implemented by configurations 800 and 900, digital signals may be communicated and processed all the way to the earbuds/headphone speakers 810-1 and 810-2. With the existence of digital processing within the earbuds/headphone speakers 810-1 and 810-2, ANC microphones can be located or at least be more easily located (e.g., with less challenges) in the earbuds/headphone speakers 810-1 and 810-2.

It should be understood—especially by those having ordinary skill in the art with the benefit of this disclosure—that that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A multichip circuit for processing audio signals having dynamic range enhancement information over two or more integrated circuits, comprising:
a host integrated circuit for determining a dynamic range enhancement gain for a digital audio input signal, processing the digital audio input signal in accordance with the dynamic range enhancement gain, and transmitting audio data based on the processed digital audio input signal; and a client integrated circuit coupled to the host integrated circuit wherein the client integrated circuit receives the audio data and wherein the client integrated circuit is provided with the dynamic range enhancement gain and the client integrated circuit processes the audio data with the dynamic range enhancement gain.

2. The multichip circuit of claim 1, wherein the host integrated circuit is further configured to transmit dynamic range enhancement information to the client integrated circuit in order to provide the client integrated circuit with the dynamic range enhancement gain.

3. The multichip circuit of claim 2, wherein the host integrated circuit further comprises a dynamic range enhancement host controller that controls and enhances a dynamic range of the digital audio input signal by the dynamic range enhancement gain and wherein the client integrated circuit further comprises a dynamic range enhancement client controller that controls and processes the audio data into an audio signal so that the audio signal is inversely gained by the dynamic range enhancement gain.

4. The multichip circuit of claim 3, wherein:
the dynamic range enhancement host controller controls and enhances the dynamic range of the digital audio input signal by the dynamic range enhancement gain by applying a digital gain in accordance with the dynamic range enhancement gain; and
the dynamic range enhancement client controller controls and processes the audio data into the audio signal by applying an analog gain in accordance with an inverse of the dynamic range enhancement gain.

5. The multichip circuit of claim 4, wherein a product of the digital gain and the analog gain approximately equals a constant value.

6. The multichip circuit of claim 1, wherein the host integrated circuit further comprises a dynamic range enhancement host rule based module for setting rules that determine the dynamic range enhancement gain that is to be applied to the digital audio input signal processed by the host integrated circuit and the client integrated circuit comprises a dynamic range enhancement client rule based module, in order to provide the client integrated circuit with the dynamic range enhancement gain, for setting and using the same rules as the dynamic range enhancement host rule based module so that an audio signal processed by the client integrated circuit is inversely gained by the dynamic range enhancement gain.

7. The multichip circuit of claim 6, wherein the host integrated circuit further comprises a dynamic range enhancement host controller coupled to the dynamic range enhancement host rule based module for controlling the dynamic range enhancement gain and wherein the client integrated circuit further comprises a dynamic range enhancement client controller coupled to the dynamic range enhancement client rule based module for controlling the inverse dynamic range enhancement gain.

8. A host integrated circuit for use in a multichip circuit for processing audio signals having dynamic range enhancement information over two or more integrated circuits, comprising:
a host controller configured to:
determine a dynamic range enhancement gain for a digital audio input signal; and
process the digital audio input signal in accordance with the dynamic range enhancement gain; and
a transmitter configured to transmit audio data based on the processed digital audio input signal to a client integrated circuit coupled to the host integrated circuit, such that the client integrated circuit is provided with the dynamic range enhancement gain in order to process the audio data with the dynamic range enhancement gain.

9. The host integrated circuit of claim 8, wherein the host integrated circuit is further configured to transmit dynamic range enhancement information to the client integrated circuit and in order to provide the client integrated circuit with the dynamic range enhancement gain.

10. The host integrated circuit of claim 9, wherein the host controller further controls and enhances a dynamic range of the digital audio input signal by the dynamic range enhancement gain in order that the client integrated circuit controls and processes the audio data into an audio signal so that the audio signal is inversely gained by the dynamic range enhancement gain.

11. The host integrated circuit of claim 9, wherein:
the host controller controls and enhances the dynamic range of the digital audio input signal by the dynamic range enhancement gain by applying a digital gain in accordance with the dynamic range enhancement gain; and
the client integrated circuit controls and processes the audio data into the audio signal by applying an analog gain in accordance with an inverse of the dynamic range enhancement gain.

12. The host integrated circuit of claim 11, wherein a product of the digital gain and the analog gain approximately equals a constant value.

13. The host integrated circuit of claim 11, wherein the host controller is further configured to control the dynamic range enhancement gain.

14. The host integrated circuit of claim 8, wherein the host integrated circuit further comprises a dynamic range enhancement host rule based module configured to set rules that determine the dynamic range enhancement gain that is to be applied to the digital audio input signal processed by the host integrated circuit, and wherein the client integrated circuit sets and uses the same rules as the dynamic range enhancement host rule based module so that an audio signal processed by the client integrated circuit is inversely gained by the dynamic range enhancement gain.

15. A client integrated circuit for use in a multichip circuit for processing audio signals having dynamic range enhancement information over two or more integrated circuits, comprising:
a receiver configured to receive audio data from a host integrated circuit in accordance with a dynamic range enhancement gain; and
a client controller configured to:
determine a dynamic range enhancement gain for a digital audio input signal; and
process the audio data in accordance with the dynamic range enhancement gain.

16. The client integrated circuit of claim 15, wherein the audio data comprises the dynamic range enhancement gain and the client integrated circuit is configured to extract the dynamic range enhancement gain from the audio data.

17. The client integrated circuit of claim 16, wherein the host integrated circuit controls and enhances a dynamic range of a digital audio input signal by the dynamic range enhancement gain to generate the audio data and the client integrated circuit is configured to control and process the audio data into an audio signal so that the audio signal is inversely gained by the dynamic range enhancement gain.

18. The client integrated circuit of claim 16, wherein:
the host controller controls and enhances the dynamic range of the digital audio input signal by the dynamic range enhancement gain by applying a digital gain in accordance with the dynamic range enhancement gain; and
the client integrated circuit controls and processes the audio data into the audio signal by applying an analog gain in accordance with an inverse of the dynamic range enhancement gain.

19. The client integrated circuit of claim 18, wherein a product of the digital gain and the analog gain approximately equals a constant value.

20. The client integrated circuit of claim 15, wherein the host integrated circuit further comprises a dynamic range enhancement host rule based module configured to set rules that determine the dynamic range enhancement gain that is to be applied to the digital audio input signal processed by the host integrated circuit, and wherein the client integrated circuit is configured to set and use the same rules as the dynamic range enhancement host rule based module so that an audio signal processed by the client integrated circuit is inversely gained by the dynamic range enhancement gain.

21. The client integrated circuit of claim 20, wherein the host integrated circuit is further configured to control the dynamic range enhancement gain.

22. A method for processing audio signals having dynamic range enhancement information over two or more integrated circuits, comprising:
processing, by a host integrated circuit, a digital audio input signal;
determining, by the host integrated circuit, a dynamic range enhancement gain for the digital audio input signal;
transmitting audio data based on the processed digital audio input signal;
receiving, by a client integrated circuit, the audio data;
providing the dynamic range enhancement gain to the host integrated circuit and the client integrated circuit; and
processing, by the client integrated circuit, the audio data with the dynamic range enhancement gain.

23. The method of claim 22, wherein providing the dynamic range enhancement gain to the host integrated circuit and the client integrated circuit further comprises:
transmitting, by the host integrated circuit, dynamic range enhancement information that includes the dynamic range enhancement gain to the client integrated circuit.

24. The method of claim 23, further comprising:
controlling and enhancing, by the host integrated circuit, a dynamic range of the digital audio input signal by using the dynamic range enhancement gain; and
controlling and processing, by the client integrated circuit, the audio data into an audio signal so that the audio signal is inversely gained by the dynamic range enhancement gain.

25. The method of claim 23, wherein:
a dynamic range enhancement host controller controls and enhances the dynamic range of the digital audio input signal by the dynamic range enhancement gain by applying a digital gain in accordance with the dynamic range enhancement gain; and
a dynamic range enhancement client controller controls and processes the audio data into the audio signal by applying an analog gain in accordance with an inverse of the dynamic range enhancement gain.

26. The method of claim 25, wherein a product of the digital gain and the analog gain approximately equals a constant value.

27. The method of claim 22, wherein providing the dynamic range enhancement gain to the host integrated circuit and the client integrated circuit further comprises:
setting, by the host integrated circuit, rules that determine the dynamic range enhancement gain that is to be applied to the digital audio input signal processed by the host integrated circuit; and
setting and using, by the client integrated circuit, the same rules set by the host integrated circuit, so that an audio signal processed by the client integrated circuit is inversely gained by the dynamic range enhancement gain.

28. The method of claim 27 further comprising:
controlling, by the host integrated circuit, the dynamic range enhancement gain that is used for the digital audio input signal; and
controlling, by the client integrated circuit, the inverse dynamic range enhancement gain that is used for the audio data.

* * * * *